United States Patent [19]

Kang

[11] Patent Number: 5,648,932

[45] Date of Patent: Jul. 15, 1997

[54] OUTPUT CONTROL CIRCUIT FOR SEMICONDUCTOR MEMORY

[75] Inventor: Hee-bok Kang, Daejon, Rep. of Korea

[73] Assignee: LG Semicon Co., Ltd., Choongchungbook-do, Rep. of Korea

[21] Appl. No.: 581,221

[22] Filed: Dec. 29, 1995

[30] Foreign Application Priority Data

Nov. 24, 1995 [KR] Rep. of Korea .................. 43559/1995

[51] Int. Cl.$^6$ ...................................... G11C 7/00
[52] U.S. Cl. .................. 365/194; 365/202; 365/203; 365/206
[58] Field of Search ........................... 365/190, 194, 365/202, 203, 206, 207, 189.05

[56] References Cited

U.S. PATENT DOCUMENTS

| | | | |
|---|---|---|---|
| 4,858,197 | 8/1989 | Aono et al. | 365/190 |
| 4,882,507 | 11/1989 | Tatsumi et al. | 365/194 |
| 5,214,609 | 5/1993 | Kato et al. | 365/189.05 |

*Primary Examiner*—Tan T. Nguyen
*Attorney, Agent, or Firm*—Birch, Stewart, Kolasch & Birch, LLP

[57] ABSTRACT

An improved output control circuit for a semiconductor memory keeping a certain dependent relationship between a data outputted from a sense amplifier and a latch enable signal when a sense amplifier output detecting unit detects a state change of a node, which includes a sense amplifier output detecting unit for initializing and enabling a sense amplifier to have a certain state when the sense amplifier is in an equalizing state in accordance with voltage applied thereto and for detecting whether voltage levels of both output nodes of the internal amplifying unit are different; a delay unit for delaying an output signal of the sense amplifier output detecting unit for a predetermined time; and an output control unit for outputting an output signal of the delay unit when the sense amplifier is enabled.

9 Claims, 5 Drawing Sheets

OUTPUT CONTROL CIRCUIT FOR SEMICONDUCTOR MEMORY

BACKGROUND OF THE INVENTION

1. Field of the Invention

The present invention relates to an output control circuit for a semiconductor memory, and particularly to an improved output control circuit for a semiconductor capable of generating a latch enable sisal using a signal outputted from a sense amplifier, so that a margin between an output data of the sense amplifier and a latch enable signal can be controlled to have an optimized state.

2. Description of the Conventional Art

FIG. 1 shows an output control circuit of a conventional semiconductor memory, which includes a plurality of cell array blocks 10 for storing data, a plurality of sense amplifiers 20 for amplifying a data read from the cell array blocks 10, a latching units 30 for latching an output signal of the sense amplifiers 20, an output buffer 40 for buffering an output signal of the latching unit 30, a plurality of address transition detection (ATD) pulse generating units 50 for detecting a transition of an address signal outputted from an address buffer (not shown), and a latch enable signal generating unit 60 for ANDing a plurality of ATD pulses outputted from the ATD pulse generating unit 50 so as to detect a transition of the ATD pulse and for generating a latch enable signal LE. Here, a sense amplifier 20 as many as the number of input/output bits of a corresponding cell array block is connected to each of the cell array blocks 10.

The operation of the output control circuit for a conventional semiconductor memory will now be explained with reference to accompanying drawings.

To begin with, in case of reading a data stored in the memory, when a data stored in a cell of the selected address is outputted from the block 10, the data is amplified by the sense amplifier 20 and is inputted to the latching unit 30. The latching unit 30 outputs the data DOUT outputted from the sense amplifier 20 to the output buffer 40 in accordance with a latch enable signal EL of the latch enable signal generating unit 60. However, the latching unit 30 outputs the data DOUT to the output buffer 40 after the data DOUT outputted from the sense amplifier 20 is completed. When the latching unit 30 outputs the data DOUT to the output buffer 40 in a state that the data DOUT outputted from the sense amplifier 20 is not completed, glitch occurs in the signal outputted therefrom. The operation that the latching unit 30 outputs the data DOUT is controlled in accordance with a latch enable signal LE outputted from the latch enable signal generating unit 60, and the data DOUT latched by the latching unit 30 in an interval in which the latch enable signal LE is a high level is outputted to the output buffer 40. Therefore, the latch enable signal LE, as shown in FIG. 2, becomes a high level after the output signal of the sense amplifier 20 has a proper margin from the time the output signal of the sense amplifier 20 is completed. It is because that when the margin is small, in state the output signal of the sense amplifier 20 is not completed, Glitch may occur therein, and when the margin is relatively big, a time delay is increased thereby. However, because the output signal of the sense amplifier 20 and a latch enable signal LE are independent from each other, it is hard to properly control the margin therebetween.

SUMMARY OF THE INVENTION

Accordingly, it is an object of the present invention to provide an output control circuit for a semiconductor memory, which overcome the problems encountered in a conventional output control circuit for a semiconductor memory.

It is another object of the present invention to provide an improved output control circuit for a semiconductor memory capable of generating a latch enable signal using a signal outputted from a sense amplifier, so that a margin between an output data of the sense amplifier and a latch enable signal can be controlled to have an optimized state.

It is another object of the present invention to provide an improved output control circuit for a semiconductor memory keeping a certain dependent relationship between a data outputted from a sense amplifier and a latch enable signal when a sense amplifier output detecting unit detects a state change of a node, and a delay unit properly delays an output signal of the sense amplifier output detecting unit, and an output signal is outputted to a latching unit in case that an output controlling unit is enabled. The above-mentioned operation is executed when both output nodes of an internal amplifying unit of a sense amplifier is equalized to have a high level and enabled. Here, either of both output nodes of the internal amplifying unit becomes a low state.

To achieve the above objects, there is provided an output control circuit for a semiconductor memory, which includes a sense amplifier output detecting unit for initializing and enabling a sense amplifier to have a certain state when the sense amplifier is in an equalizing state in accordance with voltage applied thereto and for detecting whether voltage levels of both output nodes of the internal amplifying unit are different; a delay unit for delaying an output signal of the sense amplifier output detecting unit for a predetermined time; and an output control unit for outputting an output signal of the delay unit when the sense amplifier is enabled.

DETAILED DESCRIPTION OF THE INVENTION

Figure 1:
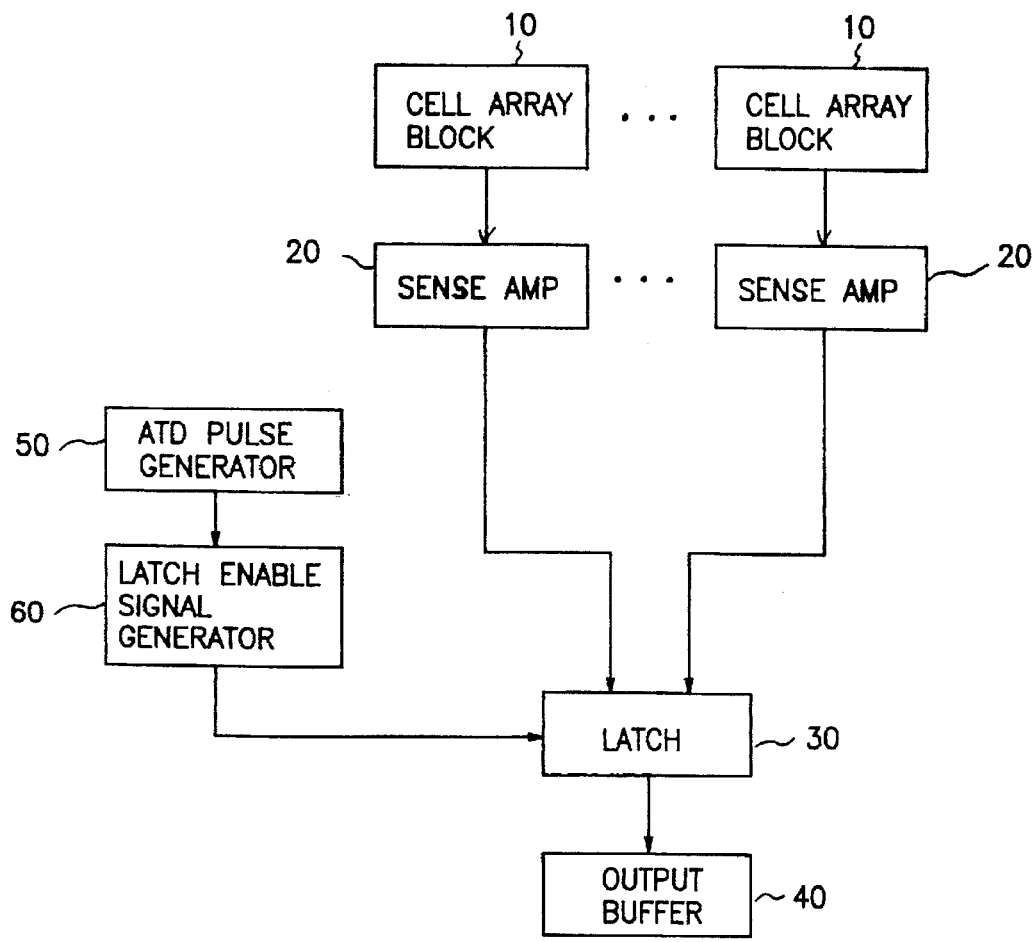
FIG. 1 is a block diagram of an output control circuit of a conventional semiconductor memory.
Figure 2:
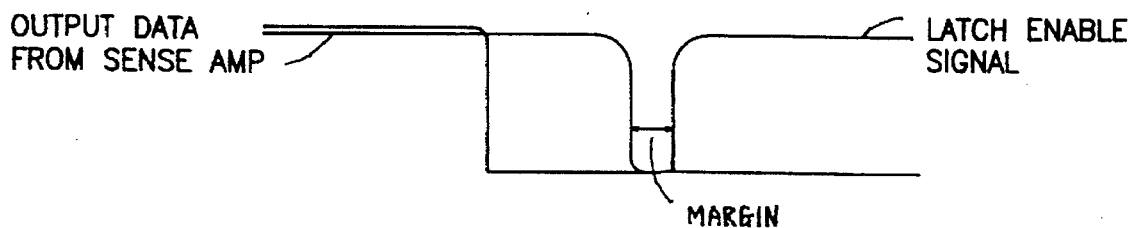
FIG. 2 is a wave form so as to explain a margin between an output signal of a sense amplifier and a latch enable signal of a conventional semiconductor memory.
Figure 3:
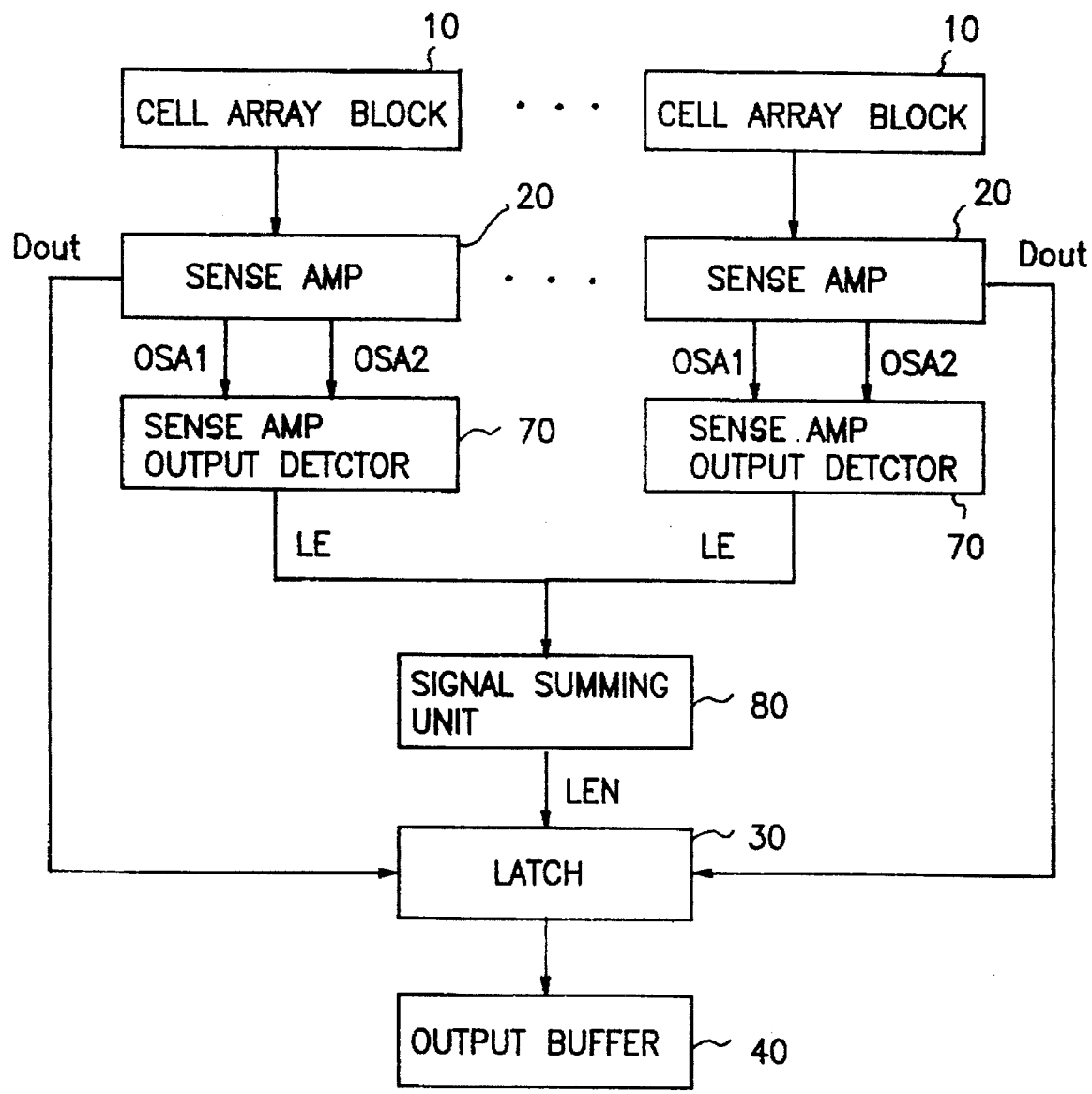
FIG. 3 is a block diagram of an output control memory of a semiconductor memory according to the present invention.

FIG. 3 shows an output control circuit for a semiconductor memory according to the present invention, which includes a plurality of cell array blocks 10, a plurality of sense amplifiers 20, a latching unit 30, an output buffer 40, a plurality of sense amplifier output detecting unit 70 for detecting output signals OSA1 and OSA2 of the sense amplifiers 20 and for generating a latch enable signal LE, and a signal combining trait 80 for ANDing latch enable signals LE outputted from the sense amplifier output detecting units 70 and for outputting a latch enable signal LEN. Here, the signal combining unit 80 is adopted instead of the ATD pulse generating unit 50 and the latch enable signal generating unit 60 of FIG. 1. When the data input/output of the cell array block 10 is executed by an 8-bit unit, eight sense amplifiers are necessary with respect to each cell array block 10; however, the present invention is directed to providing an output control circuit adopting a sense amplifier of the eight sense amplifier. Therefore, there are provided four cell array blocks 10, and when the data input/output is executed by 8-bit unit, thirty two sense amplifiers 20 are necessary; however, the present invention is directed to providing an output control circuit for each cell array block 10, that is, totally four output control circuits are necessary.

Figure 4:
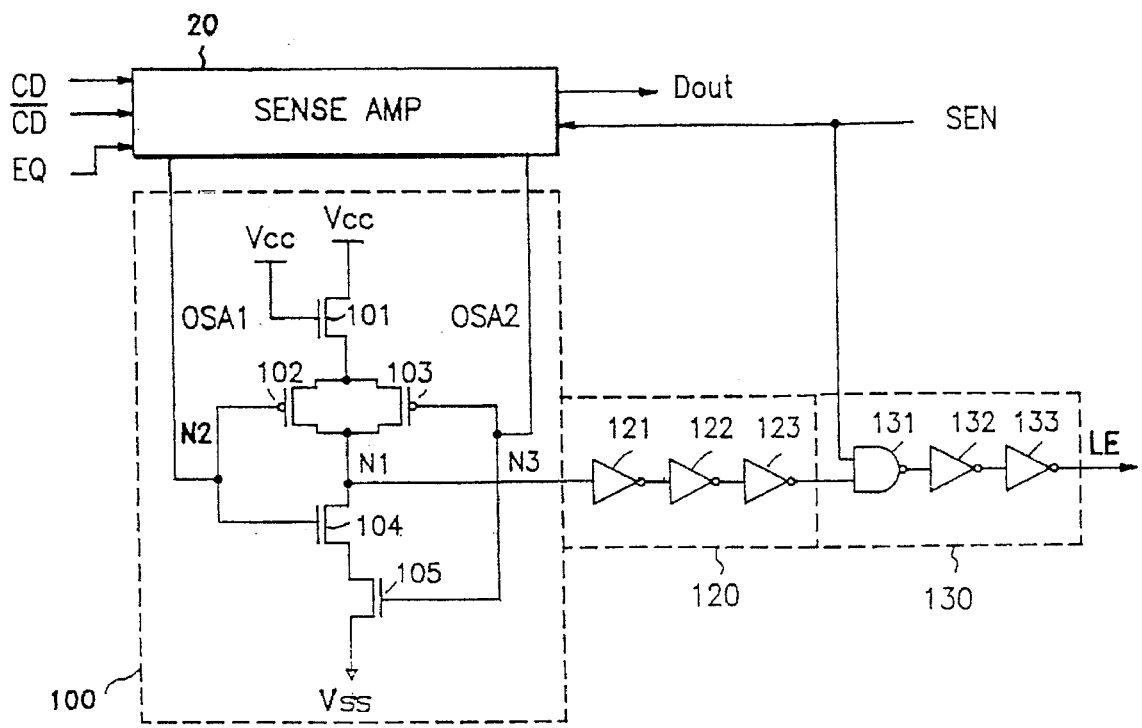
FIG. 4 is a block diagram of a sense amplifier output detecting unit of a first embodiment of FIG. 3 according to the present invention.

FIG. 4 shows a sense amplifier output detecting unit of a first embodiment according to the present invention, which includes a sense amplifier detecting unit 100 for amplifying a cell data CD and an inverted cell data/CD outputted from the cell array block 10 using its multistep amplifying unit and for being initialized to have a low level when a sense amplifier 20, which outputs intermediate signals OSA1 and OSA2 which a cell data CD and an inverted cell data/CD are amplified by a predetermined level at an output node of one amplifying unit of multistep amplifying units, is an equalizing state, and for detecting whether both output nodes of the internal amplifying unit of the sense amplifier 20 have different voltage levels, respectively, after the sense amplifier 20 is enabled, a delay unit 120 for delaying an output signal of the sense amplifier output detecting unit 100 for a determined time, and an output control unit 130 for outputting an output signal of the delay unit 120 when the sense amplifier 20 is enabled.

The sense amplifier output detecting unit 100 includes an NMOS transistor 101 having the gate electrode and the drain electrode connected to voltage, PMOS transistors 102 and 103 having the source electrodes connected to the source electrode of the NMOS transistor 101 and the gate electrodes for receiving signals OSA1 and OSA2 outputted from the sense amplifier 10, an NMOS transistor 104 having the drain electrode connected to the drain electrodes of the PMOS transistors 102 and 103 through a node N1 and the gate electrode for receiving an output signal OSA1 of the sense amplifier through a node N2, and an NMOS transistor 105 having the drain electrode connected to the source electrode of the NMOS transistor 104 and the source electrode connected to the ground and the gate electrode for receiving an output signal OSA2 of the sense amplifier 20 through a node N3.

The delay unit 120 includes invertors 121 through 123 for inverting the output signal of the node N1, and the output control unit 103 includes a NAND-gate 131 for NANDing the output signal of the invertor 123 and a sense amplifier enable signal SEN, and invertors 132 through 133 for inverting the output signal of the NAND-gate 131.

When an equalizer signal EQ of a high level is applied to the sense amplifier 20 so as to equalize the sense amplifier 20 at an initial operation stage, a voltage level of both output nodes of the multistep amplifying unit for amplifying a cell data CD and an inverted cell data/CD outputted from the cell array block 10 is equalized to have a high level in accordance with an equalizing signal EQ. The sense amplifier 20 is equalized, since the voltage level of the both output nodes of the internal amplifying unit becomes a high level, the signals OSA1 and OSA2 outputted from the both output nodes of the internal amplifying unit become a high level.

Therefore, the PMOS transistors 102 and 103 are turned on, and the NMOS transistors 104 and 105 are turned on, and the voltage level of the node N1 becomes a low level.

When the initializing operation is completed, the sense amplifying enable signal SEN is applied, and the level of an equalizer signal EQ is shifted from a high level to a lower level, and the sense amplifier 20 is operated. When the sense amplifier 20 is enabled and the equalizer state is released, voltage levels of both output nodes of the internal amplifying unit of the sense amplifier 20 becomes different by the cell data CD and the inverted cell data/CD, and the multistep internal amplifying unit amplifies the cell data CD and the inverted cell data/CD are amplified, respectively, and outputs the amplified data DOUT. Meanwhile, an internal amplifying unit of the multistep internal amplifying units outputs intermediate signals OSA1 and OSA2 which the cell data CD and the inverted cell data/CD are amplified by a predetermined level through both output nodes. Since the intermediate signals OSA1 and OSA2 correspond to the cell data CD and the inverted cell data/CD, when the intermediate signal OSA1 is a high level, the intermediate signal OSA2 becomes a low level. After the both output nodes of the internal amplifying unit of the sense amplifier 20 is equalized to a high level in accordance with an equalizer signal EQ and is operated in accordance with a sense amplifier enable signal SEN, one of voltage levels of the both output nodes of the amplifying unit which is equalized to have a high level is decreased to a low level, and the present invention is directed to using the above-mentioned result and generating a latch enable signal LE.

When the intermediate signal OSA1 is a high level, and the intermediate signal OSA1 is a low level, the PMOS transistor 102 is turned off in accordance with a high level signal OSA1, and the NMOS transistor 104 is turned on. In addition, the PMOS transistor 103 is turned on in accordance with a low level signal OSA2, and the NMOS transistor 105 is turned off. Therefore, the voltage level of the node N1 becomes a high level. When the intermediate signal OSA1 is a low level, the intermediate signal OSA2 becomes a high level. At this time, the PMOS transistor 103 is turned off in accordance with a high level signal OSA2, and the NMOS transistor 105 is turned on. In addition, the PMOS transistor 102 is turned on in accordance with a low level signal OSA1, and the NMOS transistor 104 is turned off. Therefore, as described above the voltage level of the node N1 of the sense amplifier output detecting unit 100 always becomes a high level from a low level.

The signal from the node N1 is inverted by the invertors 121 through 123 of the delay unit 120 in order, and is applied to the output control unit 130 after a predetermined delay time. The NAND gate 131 of the output control unit 130 NANDs the output signal of the invertor 123 and the sense amplifier enable signal SEN, and the invertors 132 and 133 inverts the signals in order and outputs a latch enable signal LE. The NAND gate 131 acts as a gate, and when the sense amplifier 20 operates, that is, when the sense amplifier signal SEN is a high level, the NAND gate 131 outputs a certain signal outputted from the invertor 123. In addition, the delay unit 120 controls a delay time so that the latch enable signal LE can have an optimizing margin with respect to the output data DOUT of the sense amplifier 20.

When the sense amplifier output detecting unit 70 outputs a latch enable signal LE, the signal combining unit 80 ANDs the latch enable signals LE outputted from the sense amplifier output detecting unit 70, and outputs a latch enable signal LEN to the latching unit 30. Therefore, the latching unit 30 outputs the data DOUT outputted from the sense amplifier 20 to the output buffer 40 in cooperation with the latch enable signal LEN.

Figure 5:
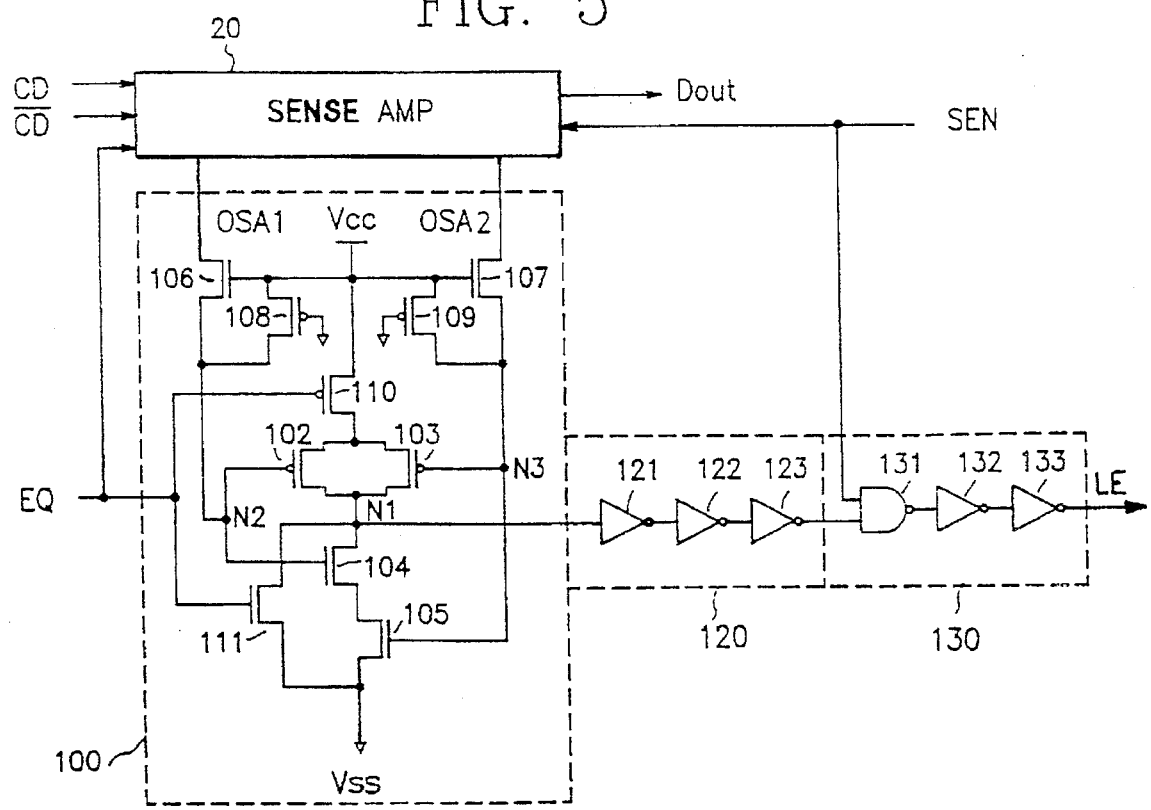
FIG. 5 is a block diagram of a sense amplifier output detecting unit of a second embodiment of FIG. 3 according to the present invention.

FIG. 5 shows a sense amplifier output detecting unit 70 of a second embodiment according to the present invention, which includes NMOS transistors 106 and 107 having the drain electrodes for receiving intermediate signals OSA1 and OSA2 outputted from a sense amplifier 20, respectively, and the gate electrodes for receiving a line voltage Vcc, PMOS transistors 108 and 109 having the source and drain electrodes connected between the gate and source electrodes of the NMOS transistors 106 and 107, and the gate electrodes for receiving a voltage level of the ground voltage level, a PMOS transistor 110 having the source electrode for receiving a line voltage and the gate electrode for receiving an equalizer signal EQ and the drain electrode connected to the source electrodes of the PMOS transistors 102 and 103, and an NMOS transistor 111 having the drain electrode connected to the node N1 and the source electrode connected to the ground and the gate electrode for receiving an equalizer signal EQ. In this embodiment, the NMOS transistor 101 of FIG. 4 is removed.

Since the operation of the second embodiment is the same as the first embodiment except the newly added element, only the different operation will now be explained.

At an initial operation state, an equalizer signal EQ of a high level to equalize the sense amplifier 20 is applied to the gate electrodes of the PMOS transistor 110 and the NMOS transistor 111, respectively. Therefore, the PMOS transistor 110 is turned off, and the NMOS transistor 111 is turned on, the voltage level of the node N1 is initialized to have a low level. In order to initialize the state of the node N1, the NMOS transistors 104 and 105 are adopted in the first embodiment; however, in the second embodiment, the transistors 110 and 111 are additionally provided.

In addition, when the node N1 in the first embodiment is initialized, the voltage level of the signals OSA1 and OSA2 applied to the gate electrodes of the PMOS transistors 102 and 103 is relatively low rather than that of the line voltage Vcc, and the voltage level of the source electrode of the PMOS transistors 102 and 103 is similar to the line voltage Vcc. Therefore, since the PMOS transistors 102 and 103 cannot substantially block the line voltage Vcc, there may occur current leakage. In order to prevent the above-mentioned problem, in the second embodiment, the PMOS transistors 108 and 109 having the gate electrodes connected to the ground and the source electrodes connected to the line voltage Vcc and the drain electrodes connected to the nodes N2 and N3, respectively, are provided, so that the voltage level of the nodes N2 and N3 are increased up to the level of the line voltage Vcc. When the voltage level applied to the gate electrodes of the PMOS transistors 102 and 103 becomes the level of the line voltage Vcc, the line voltage Vcc applied to the source terminals of the PMOS transistors 102 and 103 are substantially blocked, so that current leakage is prevented.

After the above-mentioned operation is completed, when the equalizer signal EQ becomes a low level, and the sense amplifier enable sisal SEN becomes a high level, and the sense amplifier 20 is operated, the transistors 110 and 111 do not interrupt the detection operation of the output signal of the sense amplifier.

Figure 6:
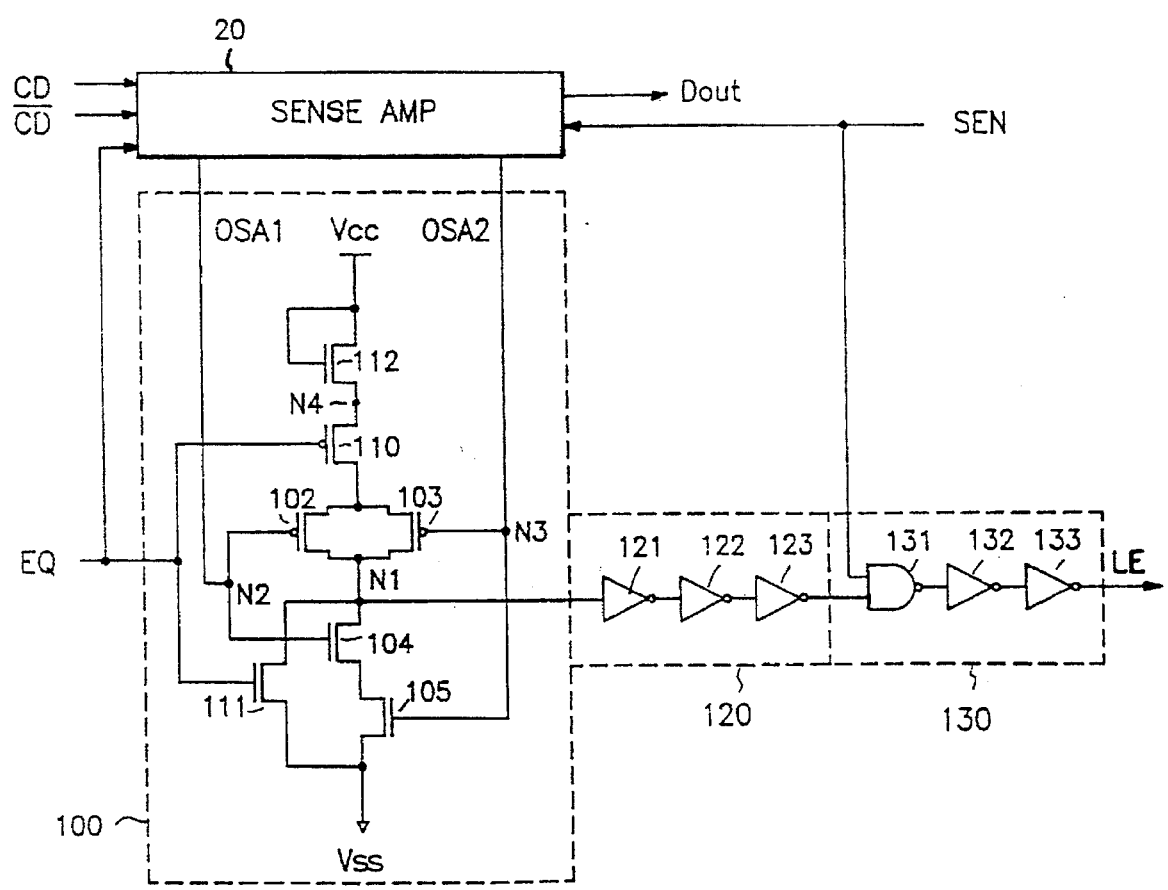
FIG. 6 is a block diagram of a sense amplifier output detecting unit of a third embodiment of FIG. 3 according to the present invention.

FIG. 6 shows a circuit of a third embodiment according to the present invention, which is directed to additionally providing an NMOS transistor 112 having the drain electrode and the gate electrode commonly connected to a line voltage Vcc and the source electrode connected to the source electrode of the PMOS transistor 110 through a node N4.

In order to prevent a current leakage at an operation initializing stage, the second embodiment is directed to increasing the voltage level applied to the gate electrodes of the PMOS transistors 102 and 103 up to the level of the line voltage Vcc; however, the third embodiment is directed to decreasing the voltage level of the node N4 down to the level of the voltage applied to the gate electrodes of the PMOS transistors 102 and 103. At the initializing stage, the high level signals OSA1 and OSA2 outputted from the sense amplifier 20 are applied to the gate electrodes of the PMOS transistors 102 and 103, respectively, and the line voltage Vcc of the node N4 is decreased by the NMOS transistor 112. Therefore, the voltage levels between the gate electrodes of the PMOS transistors 102 and 103 and the source electrodes thereof become similar, so that current leakage is advantageously prevented.

Figure 7:
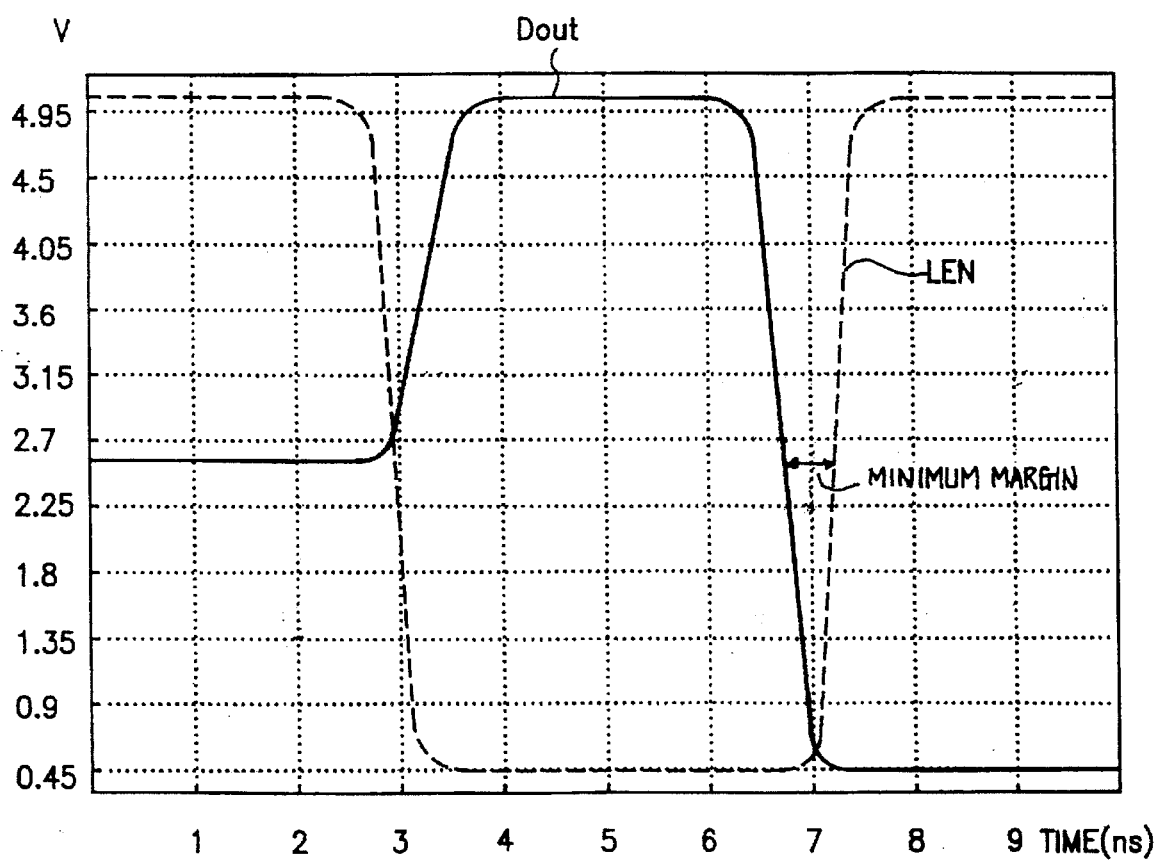
FIG. 7 is a graph showing a simulation of a sense amplifier output detecting unit according to the present invention.

FIG. 7 shows a result of a simulation with respect to the sense amplifier output detecting unit according to the present invention. As shown therein, after the output data DOUT of the sense amplifier 20 inputted to the latching unit 30 is completed, a latch enable signal LEN is generated with the minimum margin so that the thusly completed data DOUT is transmitted to the output buffer 40. That is, since the latch enable signal LEN is generated due to the output signal of the sense amplifier, even though the minimum margin is reduced below 1 ns, stable operation can be achieved, and width of a margin can be advantageously controlled.

As described above, the output control circuit for a semiconductor memory is directed to reducing speed related to the necessary margin so as to stably output the data DOUT outputted from the sense amplifier by generating a latch enable signal using an output node of the internal amplifying unit of the sense amplifier, thus removing Glitch occurrence caused due to inaccurate control timing generation, so that it is adaptable to a high speed SRAM output control method. In addition, the data outputted from the sense amplifier is generally given an initial default value of a high level. In this regard, the value of the output data of the sense amplifier may not be varied at the initial operation stage because the output data maintains a high level by the default value, so that the first output data becomes a high level. However, in this case, the present invention is further directed to accurately detecting the output of the data at the initial operation stage because of using an intermediate signal outputted from both output terminals of the internal amplifying unit of the sense amplifier. Moreover, in case that a plurality of sense amplifiers is connected to one cell array block, it is possible to detect the latch enable signal with respect to the remaining sense amplifiers using only one sense amplifier, so that it is adaptable to the product capable of processing data by a byte unit.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An output control circuit for a semiconductor memory wherein a sense amplifier output control circuit is directed to equalizing voltage of both output nodes of an internal amplifying unit to a certain state in accordance with an equalizing signal, and wherein said internal amplifying unit amplifies a cell data and a not-cell data outputted from a cell array block in accordance with a sense amplifier enable signal, comprising:

sense amplifier output detecting means for initializing and enabling a sense amplifier to have a certain state when said sense amplifier is in an equalizing state in accordance with voltage applied thereto and for detecting whether voltage levels of both output nodes of the internal amplifying means are different;

delay means for delaying an output signal of said sense amplifier output detecting means for a predetermined time; and output control means for outputting an output signal of said delay means when the sense amplifier is enabled.

2. The circuit of claim 1, wherein said sense amplifier output detecting means is initialized to a certain state by voltage levels of both output nodes of the internal amplifying means when the sense amplifier is in an equalizing state.

3. The circuit of claim 2, wherein said sense amplifier output detecting means includes means for initializing using an equalizing signal.

4. The circuit of claim 3, wherein said means is enabled when the sense amplifier is equalized and initializes the sense amplifier detecting unit.

5. The circuit of claim 1, wherein said output control means NANDs a sense amplifier enable signal and an output signal of the delay means.

6. The circuit of claim 1, wherein said sense amplifier output detecting means includes means for increasing voltage levels of a signal outputted from both output nodes of an internal amplifying means of the sense amplifier to a level of a line voltage at an initial stage.

7. The circuit of claim 6, wherein said means is a PMOS transistor having the gate electrode connected to the ground and the source and drain electrodes connected to the line voltage and an output node of the internal amplifying means, respectively.

8. The circuit of claim 1, wherein said sense amplifier output detecting means includes means for decreasing a level of a line voltage to a level of signals outputted from both output nodes of the internal amplifying means of the sense amplifier at an initial stage.

9. The circuit of claim 8, wherein said means is an NMOS transistor.

* * * * *